(12) United States Patent
Chiu et al.

(10) Patent No.: US 10,049,987 B2
(45) Date of Patent: Aug. 14, 2018

(54) ENHANCED FIDUCIAL VISIBILITY AND RECOGNITION

(71) Applicant: Intel Corporation, Santa Clara, CA (US)

(72) Inventors: Chia-Pin Chiu, Tempe, AZ (US); Kyle Yazzie, San Tan Valley, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/390,809

(22) Filed: Dec. 27, 2016

(65) Prior Publication Data
US 2018/0182712 A1   Jun. 28, 2018

(51) Int. Cl.
| B32B 3/00 | (2006.01) |
| H01L 23/544 | (2006.01) |
| H01L 23/00 | (2006.01) |

(52) U.S. Cl.
CPC ............ *H01L 23/544* (2013.01); *H01L 24/83* (2013.01); *H01L 2223/5442* (2013.01); *H01L 2223/54426* (2013.01); *H01L 2224/83122* (2013.01); *H01L 2224/83132* (2013.01)

(58) Field of Classification Search
CPC ........... H01L 23/544; H01L 2223/5442; H01L 2223/54426; H01L 2224/83122; H01L 2224/83132
See application file for complete search history.

(56) References Cited

U.S. PATENT DOCUMENTS

| 2003/0000738 A1* | 1/2003 | Rumsey ................ H01L 23/544 |
| | | 174/260 |
| 2003/0093898 A1 | 5/2003 | Rumsey et al. |
| 2006/0289975 A1 | 12/2006 | Aizpuru et al. |
| 2009/0123257 A1 | 5/2009 | Zin et al. |
| 2015/0165655 A1 | 6/2015 | Khusnatdinov et al. |
| 2016/0133591 A1* | 5/2016 | Hong ...................... H01L 24/11 |
| | | 257/737 |

FOREIGN PATENT DOCUMENTS

WO    2014052051 A2    4/2014

OTHER PUBLICATIONS

PCT Feb. 12, 2018 Notification of Transmittal of the International Search Report and the Written Opinion of the International Searching Authority for International Application No. PCT/US2017/062122; 17 pages.

* cited by examiner

*Primary Examiner* — Elizabeth E Mulvaney
(74) *Attorney, Agent, or Firm* — Patent Capital Group

(57) ABSTRACT

Particular embodiments described herein provide for a base, a plurality of fiducials on the base, and a fluid in one or more of each of the plurality of fiducials to increase recognition of each of the one or more fiducials that includes the fluid by one or more pattern recognition devices. In an example, the fluid is an epoxy and the fiducials are used to determine a placement of components in a component space.

21 Claims, 6 Drawing Sheets

ENHANCED FIDUCIAL VISIBILITY AND RECOGNITION

TECHNICAL FIELD

The present disclosure relates generally to the field of computers, and more particularly, to enhanced fiducial visibility and recognition.

BACKGROUND

Metal injection molding (MIM) is a metalworking process by which finely-powdered metal is mixed with a measured amount of binder material to comprise a "feedstock" capable of being handled by plastic processing equipment through a process known as injection molding. End products can be small components used in various industries and applications. One of those industries or applications is for electronic devices.

MIM can be used to create a chassis or base where components and electronic devices can be placed. During this process, four critical circular fiducials are typically created on on the chassis or base. One drawback to this process is that there is an inherent limitation of geometry and grain size by the MIM process such that the four fiducials cannot be easily recognized by die attach equipment. What is needed is a system, method, and apparatus to enhance fiducial visibility and recognition.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

Figure 1A:
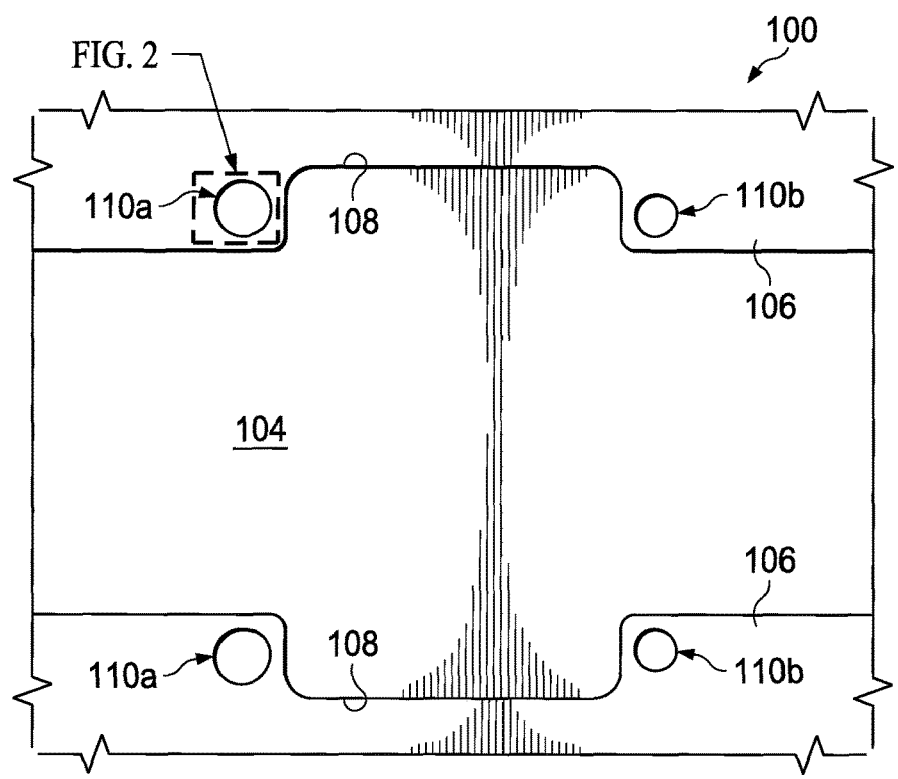
FIG. 1A is a simplified block diagram illustrating an embodiment of a base without enhanced fiducial visibility and recognition, in accordance with one embodiment of the present disclosure.

The figures of the drawings are not necessarily drawn to scale, as their dimensions can be varied considerably without departing from the scope of the present disclosure.

DETAILED DESCRIPTION

Described herein are systems and methods of enhanced fiducial visibility and recognition. In an example, an apparatus can include a base, a plurality of fiducials on the base, and a fluid in the fiducial to increase the visibility and recognition of the fiducial by one or more pattern recognition devices. In some examples, the fluid can be an epoxy.

The fiducials can be used to determine a placement of components in a component space. For example, the fiducials may be used in a die attachment process. In some instances, the fiducials are outside the component space. In a specific example, there are four fiducials and a first fiducial and a second fiducial are larger than a third fiducial and a fourth fiducial.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

Some current chassis designs are made from a metal injection molding (MIM) process for low cost. In a specific example, there are four critical circular fiducials on the chassis with diameters of three hundred (300) micro meters (um) and four hundred (400) um. The four fiducials are used in a die attachment process to determine the proper placement of components in a component space. One drawback to this process is that there is an inherent limitation of geometry and grain size by the MIM process such that the four fiducials cannot be easily recognized by die attach equipment (e.g., component or electronic device attach equipment). Because fiducials cannot be easily recognized, die placement accuracy can be significantly impacted, resulting in a high yield loss. Some current solutions to making fiducials more visible is by using electronic discharge machining (EDM) to create a shaper edge, making fiducials by using a computer numeric control (CNC) machine to create fiducials with a vertical wall, and/or making through holes as fiducials. These solutions can be expensive due to costly machining time. Also, the making of through holes as fiducials is limited by the MIM process used as it can be difficult to make through holes with a diameter less than five hundred (500) um. What is needed is a system, method, and apparatus to enhance fiducial visibility and recognition. It would be beneficial if the system, method, and apparatus did not involve any relatively complicated manufacturing process and used equipment typically available during the die attachment processing without requiring new equipment (or a slight modification of equipment that should already be present in the die attach process).

Disclosed herein are systems, apparatuses, and methods to resolve these issues (and others) and to enable enhanced fiducial visibility and recognition. In an example, a base can include a plurality of fiducials. One or more of each of the plurality of fiducials can include a fluid to increase a contrast between each fiducial that includes the fluid and the area around the fiducial. The fluid can help increase recognition of each of the one or more fiducials that includes the fluid by a pattern recognition device.

For example, a fiducial can be filled with a black or dark color epoxy to increase the contrast between the area within the fiducial and the area outside the fiducial. The increased contrast can help enable pattern recognition devices to recognize the fiducial. Note that the color of the fluid depends on the color of the area around the fiducial or base and the color of the fluid can be selected to increase the contrast of the fiducial against the area around the fiducial. For example, if the base were black or a dark color, then the fluid can be a white or light color to increase the contrast of the fiducial relatively to the base. In another example, the fluid may include a material that gives off a distinctive marker or indication of the location of the fiducial. More specifically, the fiducial may include an ultra violet (UV) emitting material that allows a pattern recognition device to locate fiducial.

The terms "over," "under," "between," and "on" as used herein refer to a relative position of one material layer or component with respect to other layers or components. For example, one device, component, or layer disposed over or under another device, component, or layer may be directly in contact with the other device, component, or layer or may have one or more intervening devices, components, or layers. Moreover, one device, component, or layer disposed between two devices, components, or layers may be directly in contact with the two devices, components, or layers or may have one or more intervening devices, components, or layers. In contrast, a first device, component, or layer "on" a second device, component, or layer is in direct contact with that second device, component, or layer. Similarly, unless explicitly stated otherwise, one feature disposed between two features may be in direct contact with the adjacent features or may have one or more intervening device, component, or layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. Operations described may be performed in a different order from the described embodiment. Various additional operations may be performed, and/or described operations may be omitted in additional embodiments. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, the terms "chip" and "die" may be used interchangeably.

FIG. 1A illustrates one embodiment of a base 100 without enhanced fiducial visibility and recognition. Base 100 can include a component space 104, edge area 106, border 108, and fiducials 110a and 110b. Base 100 can be a base or chassis where components are to be placed such as a case or chassis used in a manufacturing process for electronic devices.

Component space 104 can be a space where electronic devices and components will be placed. Edge area 106 is the area outside component space 104. Border 108 is the area between component space 104 and edge area 106. Fiducials 110a and 110b are used as a reference point in the die attachment process and help ensure the correct placement of the electronic devices and components in component space 104. In an example, fiducials 110a may be larger than fiducials 110b to help align component space 104 in the proper direction. For example, the side of component space 104 that includes the larger fiducials 110a should always be facing a specific direction (e.g., North, West, down line, etc.).

Figure 1B:
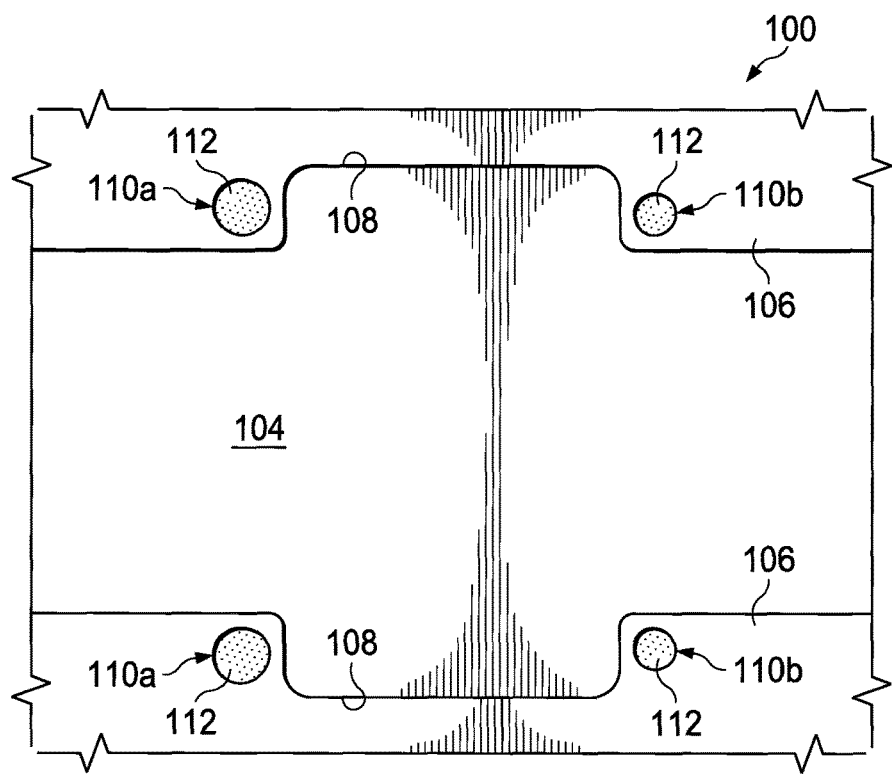
FIG. 1B is a simplified block diagram illustrating an embodiment of a base with enhanced fiducial visibility and recognition, in accordance with one embodiment of the present disclosure.
Figure 2:
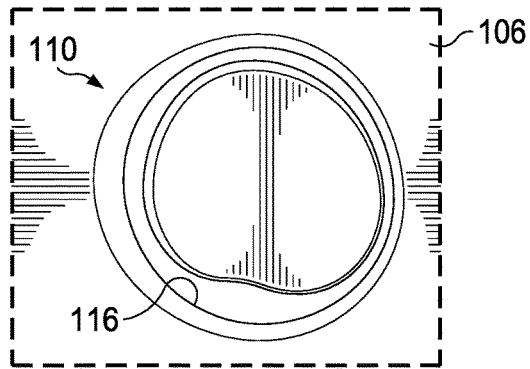
FIG. 2 is a simplified diagram illustrating a close up view of a fiducial without enhanced fiducial visibility and recognition, in accordance with one embodiment of the present disclosure.

Turning to FIG. 1B, FIG. 1B illustrates one embodiment of base 100 with enhanced fiducial visibility and recognition. As illustrated in FIG. 2, the visibility and recognition of fiducials 110a and 110b has been enhanced with fluid 112. Fluid 112 may be a liquid or other a substance that has no fixed shape and can relatively easily flow or otherwise at least partially fill a space in fiducials 110a and 110b. A coloring agent may be added to fluid 112 to enhance the visibility and recognition of fiducials 110a and 110b. In an example, fluid 112 may be a black or dark color epoxy.

Fiducial recognition requires either a very clear shape or a good contrast in a certain area such that a pattern recognition device (e.g., pattern recognition device 122b illustrated in FIG. 7) can read or otherwise identify the fiducial and identify the fiducial's location repeatedly and accurately. Fluid 112 can allow for improved fiducial visibility and recognition by pattern recognition device such that the fiducial contrast can be improved and the fiducials become more readable for the pattern recognition device. Using fluid 112 allows for fiducials to be more be easily recognized without involving complicated manufacturing processes or re-design of a chassis or base 100. Fluid 112 can be added to fiducials 110a and 110b in a relatively short amount of time and can be extended as a production solution in a manufacturing process.

Turning to FIG. 2, FIG. 2 illustrates one embodiment of a fiducial 110. Due to the small size of fiducial 110 (e.g., less than about six hundred (600) um), creating the fiducial is difficult and typically results in an unclean or misshaped edge 116. Misshaped edge 116 can make identifying fiducial 110 difficult for a pattern recognition device and even more difficult for the pattern recognition device to determine the center point of fiducial 110. As illustrated in FIG. 2, a center point of fiducial 110 can be hard to determine or recognize for a pattern recognition device.

Figure 3A:
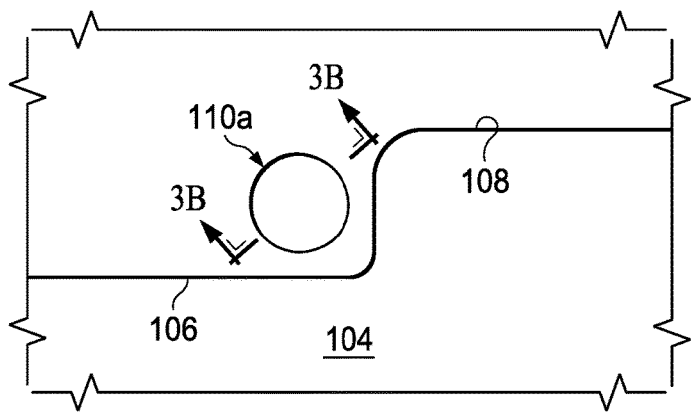
FIG. 3A is a simplified block diagram illustrating an embodiment of a base without enhanced fiducial visibility and recognition, in accordance with one embodiment of the present disclosure.
Figure 3B:
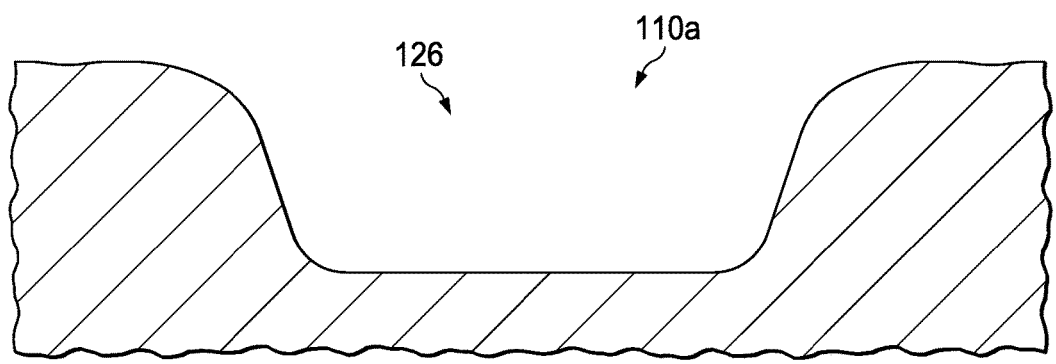
FIG. 3B is a simplified block diagram illustrating a side view of an embodiment of a fiducial without enhanced fiducial visibility and recognition, in accordance with one embodiment of the present disclosure.

Turning to FIGS. 3A and 3B, FIGS. 3A and 3B illustrates one embodiment of fiducial 110a without enhanced fiducial visibility and recognition. Fiducials (e.g., fiducials 110a and 110b) are typically created during MIM by inserting a metal pin through the molding chassis. This causes the fiducials to have a valley or trough area 126.

Figure 4A:
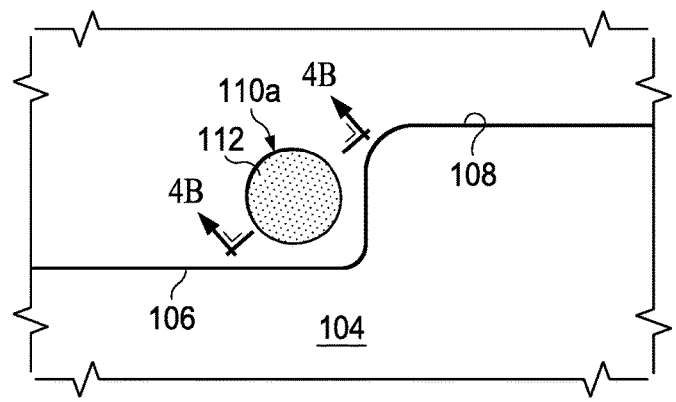
FIG. 4A is a simplified block diagram illustrating an embodiment of a base enhanced fiducial visibility and recognition, in accordance with one embodiment of the present disclosure.
Figure 4B:
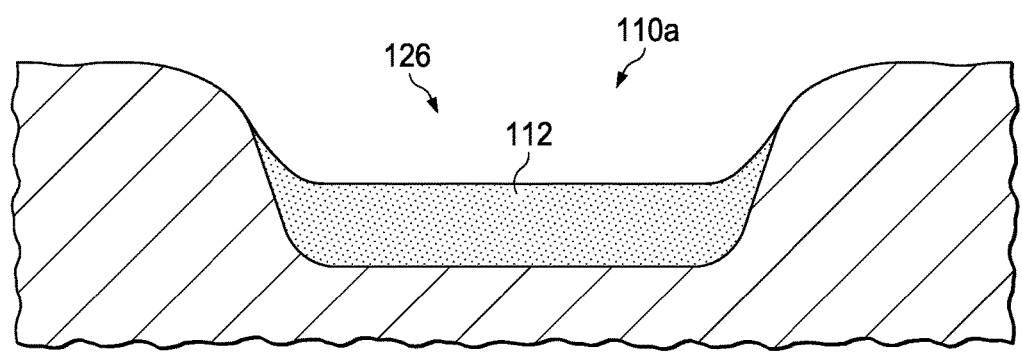
FIG. 4B is a simplified block diagram illustrating a side view of an embodiment of a fiducial enhanced fiducial visibility and recognition, in accordance with one embodiment of the present disclosure.

Turning to FIGS. 4A and 4B, FIGS. 4A and 4B illustrates one embodiment of fiducial 110a with enhanced fiducial visibility and recognition. Fluid 112 can be dropped, placed, allowed to flow into, or otherwise allowed to fill trough area 126. By allowing fluid 112 to fill trough area 126, fluid 112 can allow for improved fiducial visibility and recognition by a pattern recognition device such that the fiducial contrast can be significantly improved and the fiducial becomes more recognizable for the pattern recognition device.

Figure 5A:
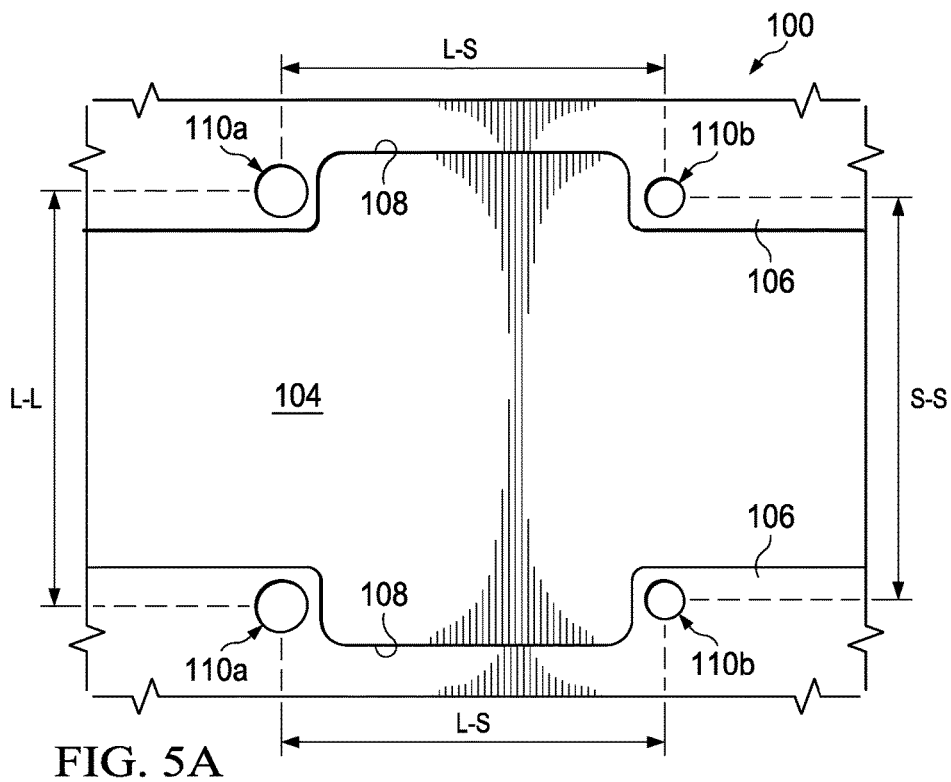
FIG. 5A is a simplified block diagram illustrating an embodiment of a base without enhanced fiducial visibility and recognition, in accordance with one embodiment of the present disclosure.

Turning to FIG. 5A, FIG. 5A illustrates one embodiment of a base 100 without enhanced fiducial visibility and recognition. In order for a component placement device (e.g., component placement device 120 illustrated in FIG. 7) to properly place one or more electronic devices and components in component space 104, the pattern recognition device (e.g., pattern recognition device 122b illustrated in FIG. 7) identifies or otherwise locates fiducials 110a and 110b. After fiducials 110a and 110b are identified, a center point of each fiducial may be determined. From the center point, the component placement device can determine the length between fiducials 110a (shown as L-L), the length between fiducials 110b (shown as S-S), and the length between fiducial 110a and 110b (shown as L-S). This allows the component placement device to precisely place electronic devices or components in their proper place and orientation in component space 104. However, as illustrated in FIG. 2, it can be difficult to locate the center point for a fiducial (e.g., fiducial 110a and/or 110b) and properly determine the length between fiducials 110a, the length between fiducials 110b, and the length between fiducial 110a and 100b. As a result, die placement accuracy can be significantly impacted, resulting in a high yield loss.

Figure 5B:
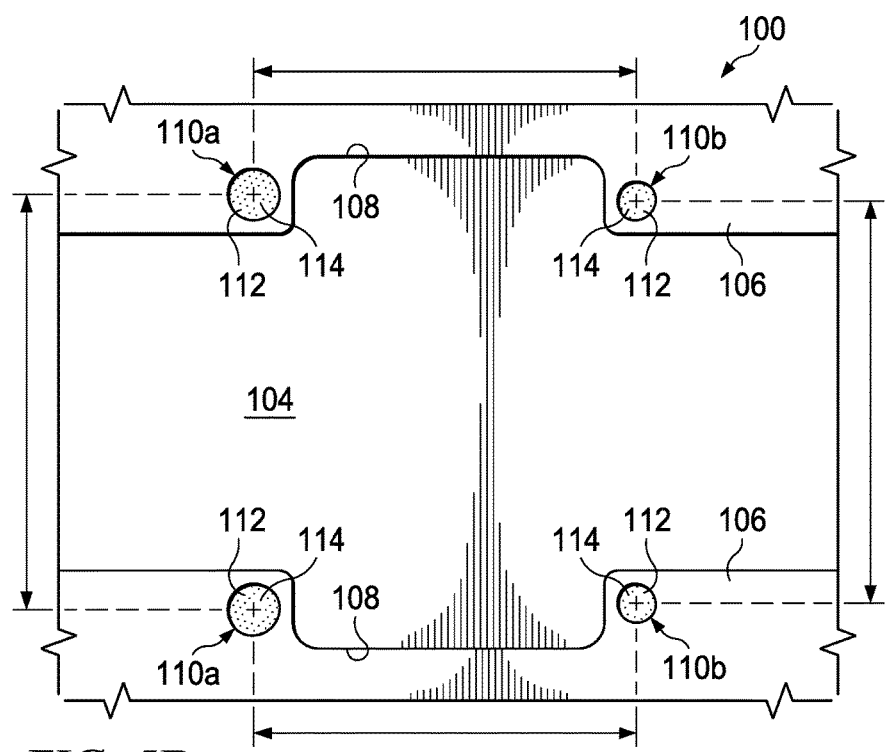
FIG. 5B is a simplified block diagram illustrating an embodiment of a base enhanced fiducial visibility and recognition, in accordance with one embodiment of the present disclosure.

Turning to FIG. 5B, FIG. 5B illustrates one embodiment of a base 100 enhanced fiducial visibility and recognition. As illustrated in FIG. 5B, fluid 112 has been added to fiducials 110a and 110b. This allows a pattern recognition device to locate fiducials 110a and 110b and a center point 114 for each fiducial to be determined with a relatively high degree of accuracy or at least a degree of accuracy greater than what would be determined as a center point for the fiducials illustrated in FIG. 5A. Once center point 114 has been determined, the length between fiducials 110a, the length between fiducials 110b, and the length between fiducial 110a and 100b can be properly determined and allow for the proper placement of electronic devices or components in their proper place and orientation in component space 104.

Figure 6:
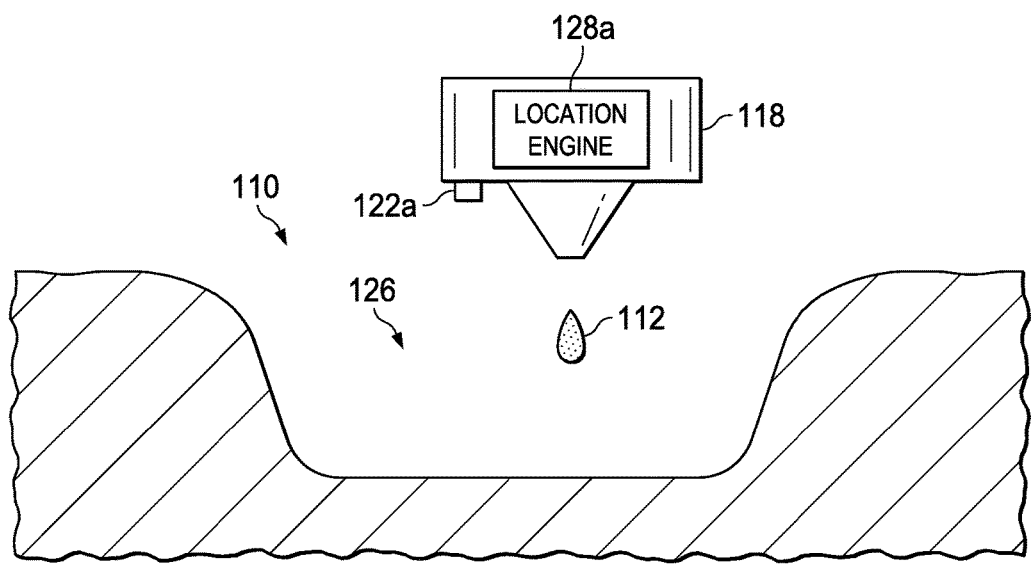
FIG. 6 is a simplified block diagram illustrating an embodiment of enabling enhanced fiducial visibility and recognition, in accordance with one embodiment of the present disclosure.

Turning to FIG. 6, FIG. 6 illustrates one embodiment of fluid 112 being dropped or otherwise deposited into fiducial 110. Fluid depositing device 118 can be configured to proximately locate fiducial 110 and deposit fluid 112 into trough area 126. To locate fiducial 110, fluid depositing device 118 can include a location engine 128a. In an example, location engine 128a can include a general location of fiducial 110 (e.g., an X and Y location on base 100, an X and Y distance from a reference point on base 100 such as X and Y from a top right corner, etc.) or the general location of fiducial 110 may be communicated to location engine 128a. In another example, fluid depositing device 118 may include a pattern recognition device 122a that can determine a general location of fiducial 110. Once fiducial 110 has been generally located, fluid depositing device 118 can deposit fluid 112 into trough area 126. Fluid 112 does not need to be deposited into the center of the fiducial as the liquid nature of fluid 112 will allow fluid 112 to disperse or flow around trough area 126 of fiducial 110.

Figure 7:
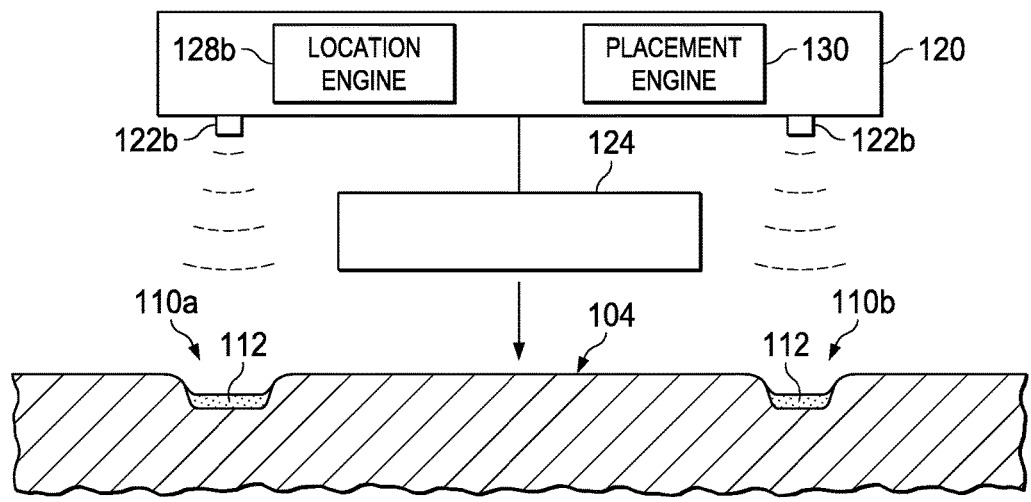
FIG. 7 is a simplified block diagram illustrating an embodiment of enabling enhanced fiducial visibility and recognition, in accordance with one embodiment of the present disclosure.

Turning to FIG. 7, FIG. 7 is a simplified block diagram illustrating an embodiment of enabling enhanced fiducial visibility and recognition, in accordance with one embodiment of the present disclosure. A component placement device 120 can include a pattern recognition device 122b. As illustrated in FIG. 7, one or more pattern recognition devices 122b can locate fiducials 110a and 110b and a center point 114 (not shown) for each fiducial. While two pattern recognition devices 122b are shown, component placement device 120 may include only one pattern recognition device 122b, as many pattern recognition devices 122b as there are fiducials, or some other configuration that allows component placement device 120 to locate the center point of the fiducials and orient and properly place one or more components 124 in component space 104. After center point 114 has been determined, location engine 128b can determine the length between fiducials 110a (illustrated in FIG. 5B), the length between fiducials 110b (illustrated in FIG. 5B), and the length between fiducial 110a and 110b (illustrated in FIG. 5B). Placement engine 130 can be configured to cause component placement device 120 to orient and properly place one or more components 124 in component space 104. Components 124 can include one or more components, electronic devices, transistors, MEMs device, optical components, magnets, etc.

Pattern recognition device 122a (illustrated in FIGS. 6) and 122b, location engine 128a (illustrated in FIGS. 6) and 128b, and placement engine 130 can all be included on the same device (e.g., component placement device 120). In an example, pattern recognition device 122b may the the same as pattern recognition device 122a (illustrated in FIG. 6). Location engine 128b may be the same as location engine 128a (illustrated in FIG. 6). In another example, pattern recognition device 122b is a different more precise device than pattern recognition device 122a because pattern recognition device 122b needs to be configured to determine the center point of fiducials 110a and/or 110b with relative precision while pattern recognition device 122a only needs to be configured to determine a proximate location of fiducials 110a and/or 110b as fluid 112 will spread or flow across fiducials 110a and 110b.

Figure 8:
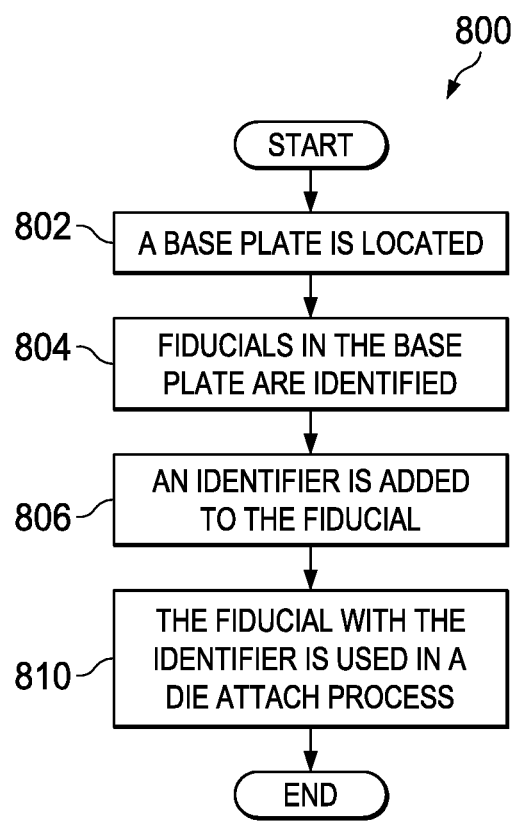
FIG. 8 is a simplified flowchart illustrating potential operations that may be associated with the communication system in accordance with an embodiment.

Turning to FIG. 8, FIG. 8 is an example flowchart illustrating possible operations of a flow 800 that may be associated with enhanced visibility and fiducial recognition, in accordance with an embodiment. In an embodiment, one or more operations of flow 800 may be performed by location engine 128b and placement engine 130. At 802, a base plate is located. At 804, fiducials in the base plate are identified. For example, pattern recognition device 122a and/or location engine 128a may be used to generally locate fiducials 110a and 110b in base 100. At 806, an identifier is added to the fiducial. For example, fluid depositing device 118 may deposit fluid 112 into trough area 126 of fiducials 110a and 110b. At 810, the fiducial with the identifier is used in a die attach process. For example, pattern recognition device 122b can locate fiducials 110a and 110b and a center point 114 for each fiducial. After center point 114 has been determined, location engine 128b can determine the length between fiducials 110a, the length between fiducials 110b, and the length between fiducial 110a and 110b. Placement engine 130 can be configured to cause component placement device 120 to orient and properly place one or more components 124 in component space 104 in a die attach process.

Although a few examples of materials from which the substrate may be formed are described here, any material that may serve as a foundation upon which a semiconductor device may be built falls within the spirit and scope of the embodiments disclosed herein. The above description of illustrated implementations, including what is described in the Abstract, is not intended to be exhaustive or to limit the scope of the disclosure to the precise forms disclosed. While specific implementations of, and examples for, the embodiments disclosed herein are described herein for illustrative purposes, various equivalent modifications are possible within the scope of the disclosure, as those skilled in the relevant art will recognize.

Note that with the examples provided herein, interaction may be described in terms of two, three, or more elements. However, this has been done for purposes of clarity and example only. In certain cases, it may be easier to describe one or more of the functionalities of a given set of flows by only referencing a limited number of elements. It should be appreciated that the examples described herein and their teachings are readily scalable and can accommodate a large number of components, as well as more complicated/sophisticated arrangements and configurations. Accordingly, the examples provided should not limit the scope or inhibit broad teachings as potentially applied to a myriad of other architectures.

It is also important to note that the operations in the preceding flow diagrams (i.e., FIG. 8) illustrate only some of the possible correlating scenarios that may be executed by, or within, location engine 128b and placement engine 130. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by location engine 128b and placement engine 130 in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although the examples have been illustrated with reference to particular elements and operations that facilitate the communication process, these elements and operations may be replaced by any suitable architecture and/or processes that achieve the intended functionality discussed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

Example 1 is an apparatus including a base, a plurality of fiducials on the base, and a fluid in one or more of each of the plurality of fiducials to increase a contrast between the base and each of the one or more fiducials that includes the fluid.

In Example 2, the subject matter of Example 1 can optionally include where the fluid is an epoxy.

In Example 3, the subject matter of any one of Examples 1-2 can optionally include where the fluid increases the recognition of the fiducial by one or more pattern recognition devices.

In Example 4, the subject matter of any one of Examples 1-3 can optionally include where the fiducials can be used to determine a placement of components in a component space.

In Example 5, the subject matter of any one of Examples 1-4 can optionally include where the fiducials can be used in a die attachment process.

In Example 6, the subject matter of any one of Examples 1-5 can optionally include where the fiducials are outside the component space.

In Example 7, the subject matter of any one of Examples 1-6 can optionally include where the plurality of fiducials are four fiducials.

In Example 8, the subject matter of any one of Example 1-7 can optionally include where a first fiducial and a second fiducial are larger than a third fiducial and a fourth fiducial.

In Example 9, a method can include locating a fiducial on a base and adding a fluid to the fiducial to increase the visibility and recognition of the fiducial by one or more pattern recognition devices.

In Example 10, the subject matter of Example 9 can optionally include where the fluid is an epoxy.

In Example 11, the subject matter of any one of Examples 9-10 can optionally include where the fiducials are used to determine a placement of components in a component space.

In Example 12, the subject matter of any one of Examples 9-11 can optionally include where the fiducials are used in a die attachment process.

In Example 13, the subject matter of any one of Examples 9-12 can optionally include where the fiducials are outside the component space.

In Example 14, the subject matter of any one of Examples 9-13 can optionally include where a first fiducial and a second fiducial are larger than a third fiducial and a fourth fiducial.

In Example 15, the subject matter of any one of Examples 9-14 can optionally include where the plurality of fiducials are four fiducials.

Example 16 is a base for a computing device including a plurality of fiducials on the base and a fluid in one or more of each of the plurality of fiducials to increase a contrast between the base and each of the one or more fiducials that includes the fluid.

Example 17 the subject matter of Example 16 can optionally include where the the fluid is an epoxy.

In Example 18, the subject matter of Example 16-17 can optionally include where the fiducials are used to determine a placement of components in a component space.

In Example 19, the subject matter of any one of the Examples 16-18 can optionally include where the fiducials are used in a die attachment process.

In Example 20, the subject matter of any one of the Examples 16-19 can optionally include where the fiducials are outside the component space.

In Example 21, the subject matter of any one of the Examples 16-20 can optionally include where a first fiducial and a second fiducial are larger than a third fiducial and a fourth fiducial.

Example 22 the subject matter of any one of the Examples 16-21 can optionally include where the plurality of fiducials are four fiducials.

In Example 23, a die attachment board can include a base, a plurality of fiducials on the base, and a fluid in one or more of each of the plurality of fiducials to increase recognition of each of the one or more fiducials that includes the fluid by one or more pattern recognition devices.

In Example 24, the subject matter of Example 23 can optionally include where the fluid is an epoxy.

In Example 25, the subject matter of any one of the Examples 23-24 can optionally include where the fiducials are used to determine a placement of components in a component space.

In Example 26, the subject matter of any one of the Examples 23-25 can optionally include where a first fiducial and a second fiducial are larger than a third fiducial and a fourth fiducial.

The invention claimed is:

1. An apparatus comprising:
a base;
a plurality of fiducials on the base; and
a fluid in one or more of each of the plurality of fiducials to increase a contrast between the base and each of the one or more fiducials that includes the fluid, wherein the fluid is an epoxy.

2. The apparatus of claim 1, wherein the fluid increases the recognition of the fiducial by one or more pattern recognition devices.

3. The apparatus of claim 1, wherein the fiducials are used to determine a placement of components in a component space.

4. The apparatus of claim 3, wherein the fiducials are used in a die attachment process.

5. The apparatus of claim 3, wherein the fiducials are outside the component space.

6. The apparatus of claim 1, wherein a first fiducial and a second fiducial are larger than a third fiducial and a fourth fiducial.

7. The apparatus of claim 1, wherein the plurality of fiducials are four fiducials.

8. A method comprising:
locating a fiducial on a base; and
adding a fluid to the fiducial to to increase recognition of the fiducial by one or more pattern recognition devices, wherein the fluid is an epoxy.

9. The method of claim 8, wherein the fiducials are used to determine a placement of components in a component space.

10. The method of claim 9, wherein the fiducials are used in a die attachment process.

11. The method of claim 9, wherein the fiducials are outside the component space.

12. The method of claim 8, wherein the fluid a fluid increases a contrast between the base and each of the one or more fiducials that includes the fluid.

13. The method of claim 12, wherein and a first fiducial and a second fiducial are larger than a third fiducial and a fourth fiducial.

14. A base for a computing device comprising:
a plurality of fiducials on the base; and
a fluid in one or more of each of the plurality of fiducials to increase a contrast between the base and each of the one or more fiducials that includes the fluid, wherein the fluid is an epoxy.

15. The base for the computing device of claim 14, wherein the fiducials are used to determine a placement of components in a component space.

16. The base for the computing device of claim 15, wherein the fiducials are used in a die attachment process.

17. The base for the computing device of claim 15, wherein the fiducials are outside the component space.

18. The base for the computing device of claim 14, wherein a first fiducial and a second fiducial are larger than a third fiducial and a fourth fiducial.

19. A die attachment board, comprising:
a base;
a plurality of fiducials on the base; and
a fluid in one or more of each of the plurality of fiducials to increase recognition of each of the one or more fiducials that includes the fluid by one or more pattern recognition devices, wherein the fluid is an epoxy.

20. The die attachment board of claim 19, wherein the fiducials are used to determine a placement of components in a component space.

21. The die attachment board of claim 19, wherein a first fiducial and a second fiducial are larger than a third fiducial and a fourth fiducial.

* * * * *

UNITED STATES PATENT AND TRADEMARK OFFICE
CERTIFICATE OF CORRECTION

PATENT NO. : 10,049,987 B2
APPLICATION NO. : 15/390809
DATED : August 14, 2018
INVENTOR(S) : Chia-Pin Chiu et al.

It is certified that error appears in the above-identified patent and that said Letters Patent is hereby corrected as shown below:

In the Claims

In Column 10, Line 8, in Claim 8, delete "to to" and insert -- to --, therefor.

Signed and Sealed this
First Day of January, 2019

Andrei Iancu
*Director of the United States Patent and Trademark Office*